US008847586B2

(12) United States Patent
Suzuki (10) Patent No.: US 8,847,586 B2
(45) Date of Patent: Sep. 30, 2014

(54) INSPECTION APPARATUS AND INSPECTION METHOD OF MAGNETIC SENSOR

(75) Inventor: Takashi Suzuki, Fukuroi (JP)

(73) Assignee: Yamaha Corporation, Hamamatsu-Shi, Shizuoka-Ken (JP)

( * ) Notice: Subject to any disclaimer, the term of this patent is extended or adjusted under 35 U.S.C. 154(b) by 201 days.

(21) Appl. No.: 13/569,666

(22) Filed: Aug. 8, 2012

(65) Prior Publication Data
US 2013/0038321 A1    Feb. 14, 2013

(30) Foreign Application Priority Data

Aug. 10, 2011  (JP) ................................. 2011-175337

(51) Int. Cl.
*G01N 27/72*    (2006.01)
*G01R 33/00*    (2006.01)
*G01R 35/00*    (2006.01)

(52) U.S. Cl.
CPC ............ *G01R 35/00* (2013.01); *G01R 33/0052* (2013.01); *G01R 33/0035* (2013.01)
USPC .......... 324/224; 374/163; 374/141; 374/166; 374/162; 374/110; 374/45; 324/515; 324/529; 324/750.14; 324/754.17; 324/754.29; 324/244; 324/225; 324/260; 324/235; 324/228; 324/232; 324/238

(58) Field of Classification Search
CPC ............................ G01R 35/00; G01R 33/0035
USPC ............... 324/515, 529, 750.14, 224, 754.17, 324/754.29, 244, 225, 260, 235, 228, 232, 324/238; 374/163, 141, 166, 162, 110, 45
See application file for complete search history.

(56) References Cited

U.S. PATENT DOCUMENTS 4,327,498 A * 5/1982 Setter et al. ..................... 33/333
4,450,406 A * 5/1984 Bobb ............................. 324/247
(Continued)

FOREIGN PATENT DOCUMENTS

CN         2572416 Y    9/2003
JP      62-055977 A    3/1987
(Continued)

OTHER PUBLICATIONS

Guo et al., "Calibration of Sensing Coils of a Three-dimensional Magnetic Property Tester", INTERMAG 2006, p. 588.*
(Continued)

*Primary Examiner* — Patrick Assouad
*Assistant Examiner* — Lamarr Brown
(74) *Attorney, Agent, or Firm* — Dickstein Shapiro LLP (57) ABSTRACT

A magnetic sensor inspection apparatus has a rectangular frame including a stage, a probe card, and a plurality of magnetic field generating coils. A wafer-like array of magnetic sensors is mounted on the stage, which is movable in horizontal and vertical directions. The probe card includes a plurality of probes which are brought into contact with a plurality of magnetic sensors encompassed in a measurement area. The magnetic field generating coils are driven to generate a magnetic field toward the stage. A plurality of magnetic field environment measuring sensors is arranged in the peripheral portion of the probe card surrounding the probes. A magnetic field controller controls magnetic fields generated by the magnetic field generating coils based on the measurement result of the magnetic field environment measuring sensors. Thus, it is possible to concurrently inspect a wafer-like array of magnetic sensors with the probe card.

7 Claims, 6 Drawing Sheets

(56) References Cited

U.S. PATENT DOCUMENTS

| | | | |
|---|---|---|---|
| 4,575,695 A * | 3/1986 | Schloemann | 333/24.1 |
| 4,952,858 A * | 8/1990 | Galburt | 318/647 |
| 5,032,792 A * | 7/1991 | Wing et al. | 324/228 |
| 5,086,270 A * | 2/1992 | Karasawa et al. | 324/750.29 |
| 6,744,228 B1 * | 6/2004 | Cahill et al. | 318/135 |
| 6,906,546 B2 * | 6/2005 | Tanioka et al. | 324/750.1 |
| 7,759,931 B2 * | 7/2010 | Tsukada et al. | 324/235 |
| 2004/0061514 A1 * | 4/2004 | Schwindt et al. | 324/754 |
| 2004/0189292 A1 | 9/2004 | Kautz | |
| 2004/0196031 A1 * | 10/2004 | Nagano | 324/230 |
| 2005/0286607 A1 * | 12/2005 | Kim et al. | 374/120 |
| 2006/0049823 A1 * | 3/2006 | Suzuki | 324/202 |
| 2008/0106257 A1 * | 5/2008 | Suzuki | 324/202 |
| 2008/0309330 A1 * | 12/2008 | Ohyu et al. | 324/232 |
| 2013/0009659 A1 * | 1/2013 | Liu et al. | 324/756.02 |
| 2013/0057270 A1 * | 3/2013 | Klein et al. | 324/244 |

FOREIGN PATENT DOCUMENTS

| | | |
|---|---|---|
| JP | 2004-151056 A | 5/2004 |
| JP | 2007-024518 A | 2/2007 |
| JP | 2007-057547 A | 3/2007 |

OTHER PUBLICATIONS

Chinese Office Action issued for corresponding Chinese application CN 201210282442.0, mailing date May 19, 2014 (English translation attached).

* cited by examiner

INSPECTION APPARATUS AND INSPECTION METHOD OF MAGNETIC SENSOR

BACKGROUND OF THE INVENTION

1. Field of the Invention

The present invention relates to an inspection apparatus and an inspection method for use in inspection routines of magnetic sensors, in particularly for use in routines of inspecting a wafer-like array of magnetic sensors in terms of their magnetic property and sensitivity via magnetic property testing under predetermined environmental conditions.

The present application claims priority on Japanese Patent Application No. 2011-175337, the content of which is incorporated herein by reference.

2. Description of the Related Art

According to conventionally-known inspection routines of magnetic properties of magnetic sensors, magnetic sensors are each placed in a magnetic field which is generated using magnetic field generating coils such as Helmholtz coils and subsequently subjected to testing to measure their output signals. Inspecting each single magnetic sensor enclosed in its package needs troublesomeness treatment and may suffer a financial loss in the assembling cost of magnetic sensors which are determined as defective ones through inspection. For this reason, it is an efficient way to collectively inspect a wafer-like array of magnetic sensors. Various technologies for inspecting a wafer-like array of magnetic sensors have been developed and disclosed in various documents such as PLT 1 and PLT 2.

PLT 1 disclosed an inspection method of a magnetic sensor chip. Herein, a test probe is brought into contact with a magnetic sensor chip, and then a magnetic field generator is moved close to the magnetic sensor chip in a preparation stage of inspection. Specifically, the distal end of a coil prober approaches a magnetic sensor so as to apply a magnetic field to the magnetic sensor, thus measuring the output signal of a magnetic sensor with a test probe. The distal end of a coil prober is able to generate a magnetic field with a single directivity. For the purpose of inspecting the output signal of a magnetic sensor exposed to an external magnetic field with multiple directivities, it is necessary to rotate the relative positioning between a coil prober and a magnetic sensor.

PLT 2 disclosed an inspection method of a magnetic sensor by use of a probe card which is brought into contact with a magnetic sensor. Specifically, a probe card including a plurality of coils is brought into contact with a wafer fabricating a magnetic sensor; electric currents are supplied to the coils of a probe card so as to apply a magnetic field to a magnetic sensor, thus detecting the output signal of a magnetic sensor with the probe card. This technology is able to change the magnitude and/or the directivity of a magnetic field applied to a magnetic sensor by changing electric currents supplied to a plurality of coils included in a probe card.

PLT 3 disclosed a weak magnetic field generator and an inspection method of a magnetic sensor, which does not necessarily relate to inspection of a magnetic sensor. Herein, an external magnetic field is applied to a geomagnetic bearing sensor with sensitivity in two directions having a rectangle angle therebetween in a single plane, and then an electric signal is supplied to a geomagnetic bearing sensor, thus analyzing the output signal of a geomagnetic sensor. Specifically, this inspection method utilizes a substrate table equipped with a socket for arranging a magnetic sensor, a magnetic field generating coil, and a magnetic field sensor, wherein the detection result of a magnetic field sensor is fed back to a magnetic field generating coil.

As described above, it is an efficient way to collectively inspect a plurality of magnetic sensors rather than each single magnetic sensor. In this case, it is necessary to employ a large coil which is able to generate a magnetic field covering a relatively large inspection area encompassing a plurality of sensors. The foregoing technologies disclosed in PLT 1 and PLT 2 utilize a probe card equipped with a coil; hence, it is difficult to enlarge the size of a coil due to its structural limitation. Additionally, they may undergo local variation of a magnetic field which is generated to cover a large inspection area. That is, the foregoing technologies of PLT 1 and PLT 2 may be degraded in their accuracy of inspection results because they simply control an electric current to determine whether or not a desired magnetic field is generated with a coil.

The other technology such as PLT 3 may be an effective solution to this problem because the detection result of a magnetic field sensor is fed back to a magnetic field generating coil. However, this technology needs a single table equipped with a magnetic field sensor, a socket, and a magnetic field generating coil, wherein for the purpose of preventing interference with the socket and the coil in their positioning, the magnetic sensor is arranged in the backside of the table opposite to the socket. This arrangement may not accurately detect a magnetic field affecting a magnetic sensor installed in the socket. That is, this technology may suffer from low inspection accuracy.

CITATION LIST

Patent Literature

PLT 1: Japanese Patent Application Publication No. S62-55977
PLT 2: Japanese Patent Application Publication No. 2007-57547
PLT 3: Japanese Patent Application Publication No. 2004-151056

SUMMARY OF THE INVENTION

It is an object of the present invention to provide an inspection apparatus and an inspection method, which are able to collectively inspect a wafer-like array of magnetic sensors with high accuracy.

The present invention relates to a magnetic sensor inspection apparatus including a stage for mounting a wafer-like array of magnetic sensors thereon, which is movable in a horizontal direction and a vertical direction; a probe card which is positioned opposite to the stage and which is equipped with a plurality of probes that are brought into contact with the magnetic sensors encompassed in the measurement area; a plurality of magnetic field generating coils which are positioned to surround the probe card and the stage so as to generate a magnetic field toward the magnetic sensors mounted on the stage; a plurality of magnetic field environment measuring sensors which are disposed in a peripheral portion of the probe card surrounding the probes; and a magnetic field controller for controlling magnetic fields generated by the magnetic field generating coils based on the measurement result of the magnetic field environment measuring sensors.

The present invention relates to a magnetic sensor inspection method using the magnetic sensor inspection apparatus including a stage, a probe card having a plurality of probes, a plurality of magnetic field generating coils surrounding the stage and the probe card, and a plurality of magnetic field environment measuring sensors disposed in the peripheral portion of the probe card surrounding the probes. Specifically, the magnetic sensor inspection method includes the steps of: mounting a wafer-like array of magnetic sensors on the stage; moving the stage in a horizontal direction and/or a vertical direction so as to bring the probes in contact with the magnetic sensors on the stage; driving the magnetic field generating coils so as to generate a magnetic field toward the magnetic sensors on the stage; adjusting magnetic fields generated by the magnetic field generating coils by way of feedback control based on the measurement result of the magnetic field environment measuring sensors; and concurrently inspecting the magnetic sensors with the probe card.

The present invention is characterized by arranging the magnetic field generating coils not on the probe card but outside of the probe card, thus generating a magnetic field covering a relatively large space encompassing the probes and their periphery. Subsequently, the probes are collectively brought into contact with the magnetic sensors so that a magnetic field is exerted concurrently on the magnetic sensors on the stage. This makes it possible to concurrently inspect the magnetic sensors with the probe card. In the inspection routine, a magnetic field exerted in the measurement area of the probe card is measured with the magnetic field environment measuring sensors, the measurement result of which is fed back to the magnetic field generating coils, thus controlling the magnetic field generating coils to accurately generate a magnetic field with desired intensity and desired directivity in the measurement area. The stage is appropriately moved horizontally and vertically so that a wafer-like array of magnetic sensors is brought in contact with the probes. This makes it possible to consecutively inspect the magnetic sensors without interruption.

Additionally, the present invention is characterized by arranging the temperature environment measuring sensors in proximity to the magnetic field environment measuring sensors in the peripheral portion of the probe card, wherein the magnetic field controller corrects (or adjusts) the measurement result of the magnetic field environment measuring sensors based on the measurement result of the temperature environment measuring sensors, thus controlling magnetic fields generated by the magnetic field generating coils based on the corrected (or adjusted) measurement result. This is because the sensitivity of the magnetic field environment measuring sensors may fluctuate depending on the temperature which may be varied or changed due to the surrounding environment or the inspection routine. Thus, it is necessary to correct (or adjust) the measurement result of the magnetic field environment measuring sensors based on the currently detected temperature in the measurement field. This realizes accurate magnetic testing (or accurate magnetic inspection) without being influenced by the surrounding temperature or the temperature-related condition.

Moreover, it is possible to install a temperature adjuster which is able to adjust the stage temperature at a desired temperature. This makes it possible to easily inspect variations of magnetic property at different temperatures. In this connection, it is possible to feed back the stage temperature to the magnetic field controller in addition to the measurement result of the temperature environment measuring sensors.

As described above, the present invention is designed to concurrently inspect a wafer-like array of magnetic sensors instead of individual pieces of magnetic sensors which are separated from each other, wherein a magnetic field is applied to the magnetic sensors collectively so as to concurrently inspect magnetic properties of magnetic sensors. Additionally, a magnetic field currently exerted in the measurement area is measured with the magnetic field environment measuring sensors, installed in the probe card, and fed back to the magnetic field controller, which in turn controls the magnetic field generating coils to accurately generate a desired magnetic field with desired intensity and desired directivity. Thus, it is possible to improve inspection accuracy when inspecting magnetic properties of magnetic sensors.

BRIEF DESCRIPTION OF THE DRAWINGS

These and other objects, aspects, and embodiments of the present invention will be described in more detail with reference to the following drawings.

DESCRIPTION OF THE PREFERRED EMBODIMENT

The present invention will be described in further detail by way of examples with reference to the accompanying drawings.

Figure 1:
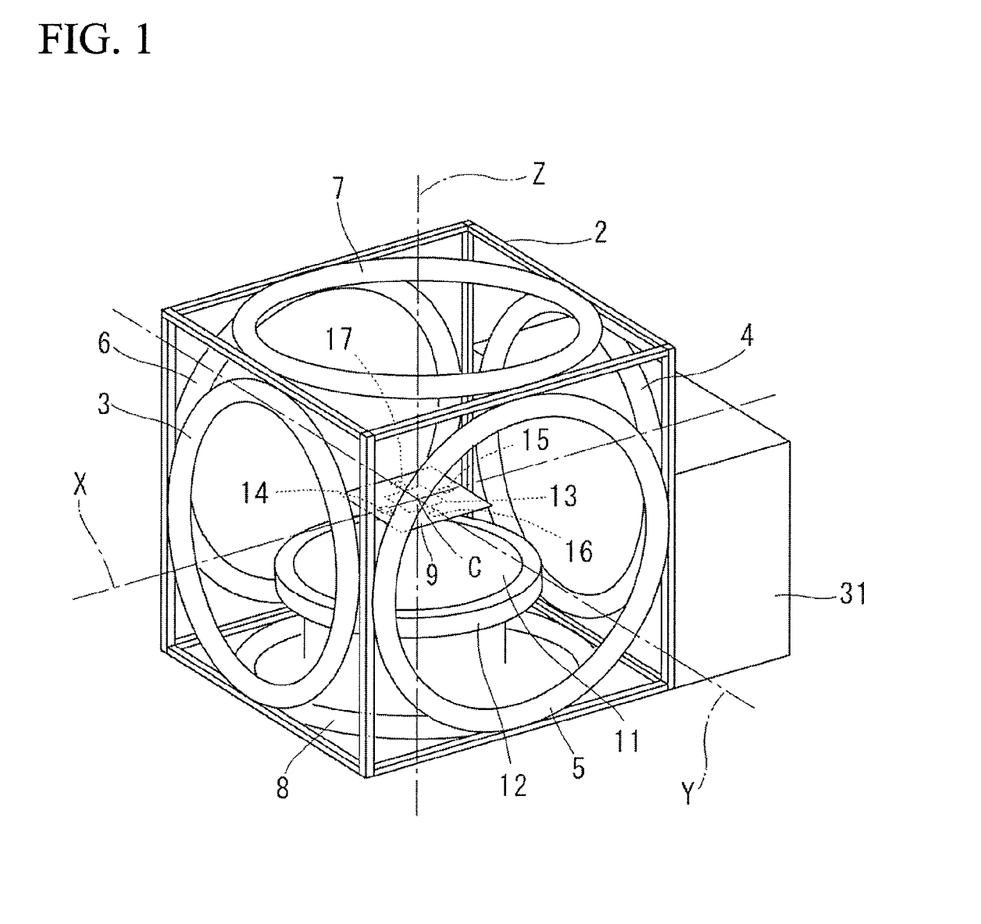
FIG. 1 is a perspective view of a magnetic sensor inspection apparatus according to a preferred embodiment of the present invention.

FIG. 1 is a perspective view of a magnetic sensor inspection apparatus 1 according to a preferred embodiment of the present invention. The entire structure of the magnetic sensor inspection apparatus 1 is defined using a frame 2 equipped with which six magnetic field generating coils 3 to 8 and a single probe card 9. The frame 2 is equipped with a movable stage 12 for mounting a sensor aggregation 11 which is a wafer-like array of magnetic sensors 10.

The magnetic field generating coils 3 to 8 are subdivided into plural pairs of coils, in which two coils are paired and arranged opposite to each other in an axial direction. The magnetic field generating coils 3, 4 are paired and attached to the left and right sides of the frame 2; the magnetic field generating coils 5, 6 are paired and attached to the front and rear sides of the frame 2; the magnetic field generating coils 7, 8 are paired and attached to the upper and lower sides of the frame 2. That is, three pairs of the magnetic field generating coils 3 to 8 are arranged in different axial directions perpendicularly crossing each other. The entire shape of the magnetic sensor inspection apparatus 1 is defined as a cube shape with the frame 2.

Specifically, a pair of the magnetic field generating coils 3, 4 is aligned in an X-axis direction (or a horizontal direction between the left and right sides of the frame 2); a pair of the magnetic field generating coils 5, 6 is aligned in a Y-axis direction (or a front-rear direction between the front and rear sides of the frame 2) perpendicular to the X-axis direction; and a pair of the magnetic field generating coils 7, 8 is aligned in a Z-axis direction (or a vertical direction between the upper and lower sides of the frame 2) perpendicular to the X-axis direction and the Y-axis direction. FIG. 1 shows X-axis, Y-axis, and Z-axis directions using dashed lines. The three pairs of the magnetic field generating coils 3 to 8 generate their magnetic fields in three axial directions consisting of the X-axis, Y-axis, and Z-axis directions, so that a three-axial composite magnetic field is applied to a center position C at which the axial directions of the magnetic field generating coils 3 to 8 are crossing each other.

The probe card 9 is fixed at the center position C in the space of the frame 2 surrounded by the magnetic field generating coils 3 to 8. For the sake of simplifying illustration, FIG. 1 does not show the fixing structure of the probe card 9.

Figure 2:
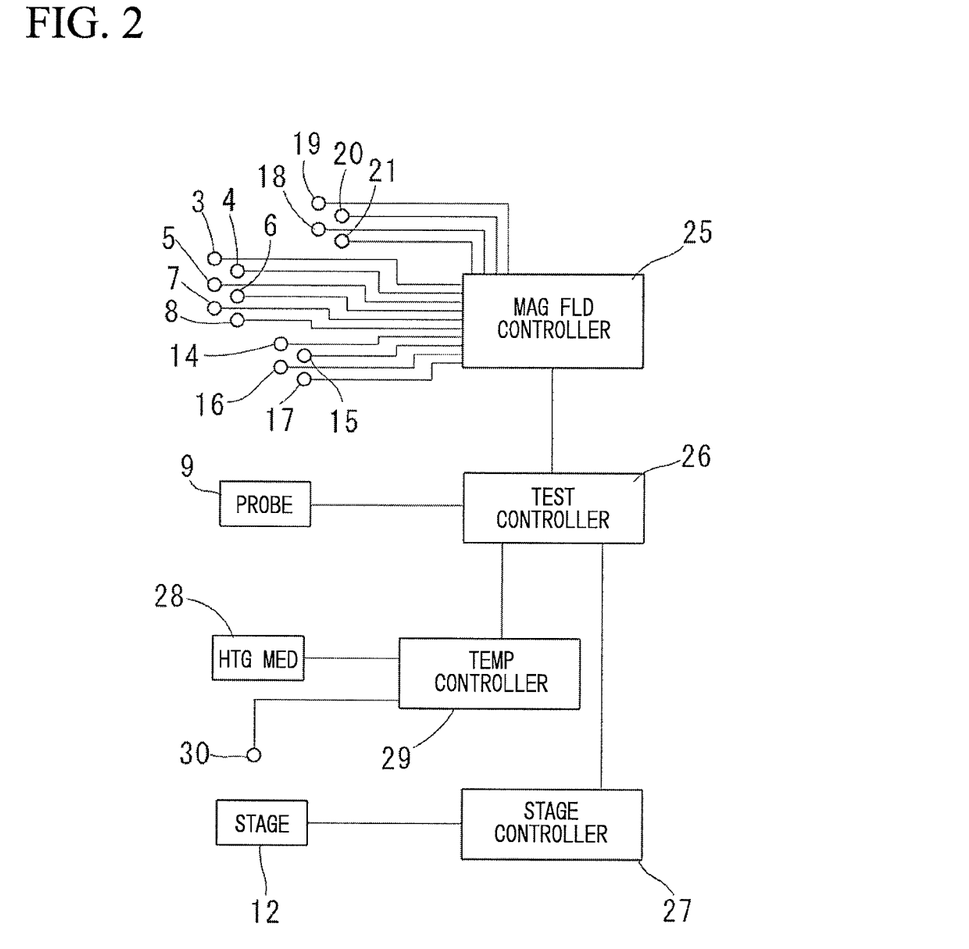
FIG. 2 is a block diagram of the magnetic sensor inspection apparatus.
Figure 3:
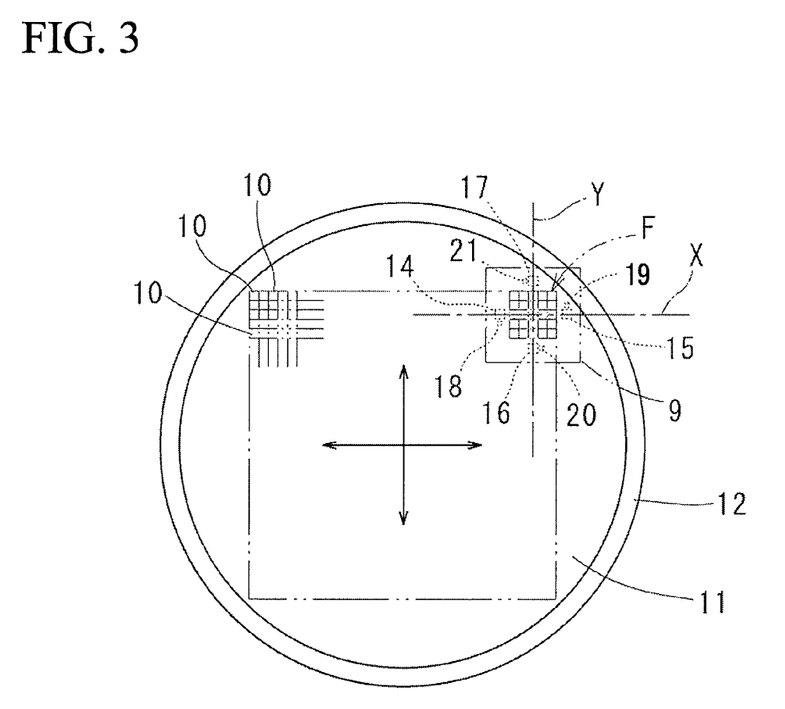
FIG. 3 is a plan view illustrating the positional relationship between a probe card and a stage 12 included in the magnetic sensor inspection apparatus.
Figure 4:
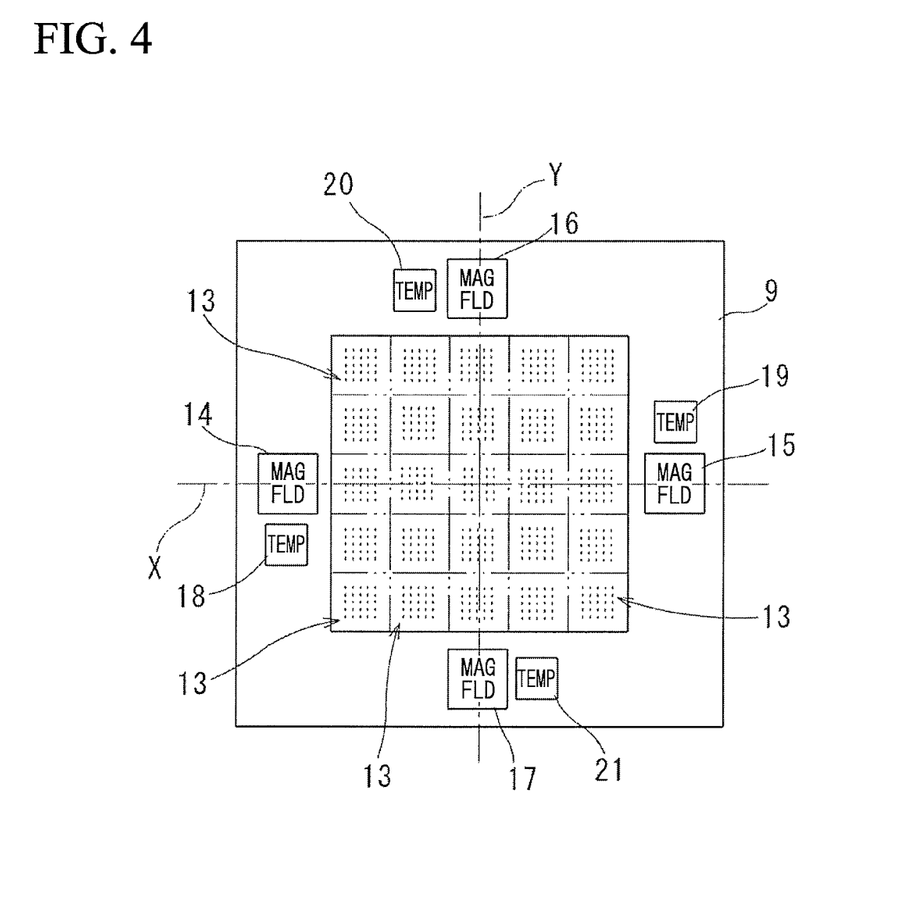
FIG. 4 is a front view of the probe card.
Figure 5:
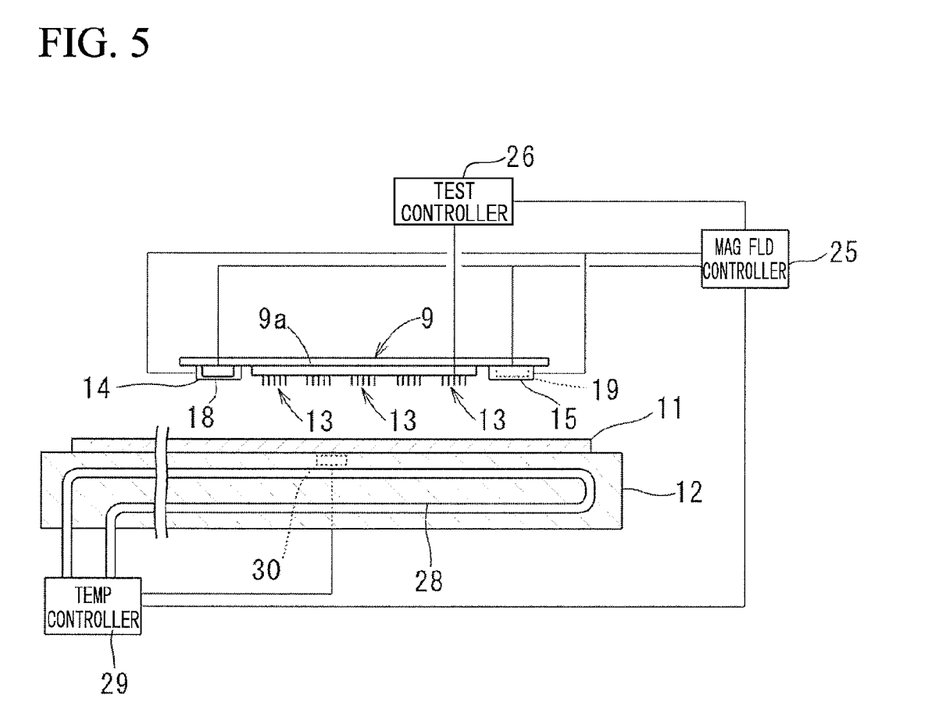
FIG. 5 is a longitudinal-sectional view of the magnetic sensor inspection apparatus of FIG. 1.

FIG. 2 is a block diagram of the magnetic sensor inspection apparatus 1. FIG. 3 is a plan view illustrating the positional relationship between the probe card (PROBE) 9 and the stage 12 in the magnetic sensor inspection apparatus 1. FIG. 4 is a front view of the probe card 9. FIG. 5 is a cross-sectional view of the magnetic sensor inspection apparatus 1 of FIG. 1.

As shown in FIG. 5, the probe card 9 has a printed-wiring substrate 9a which is fixed in a horizontal direction and which is equipped with a plurality of probes 13 on the backside thereof. These probes 13 are able to concurrently come in contact with the predetermined number of magnetic sensors 10, which are arranged in a square-shaped measurement area F (see FIG. 3) in plan view, among numerous magnetic sensors 10 which are included in the sensor aggregation 11 and aligned on a wafer. The probes 13 project downwardly from the printed-wiring substrate 9a. In FIGS. 3 to 5, a set of probes (or needles) which should be concurrently brought into contact with a single magnetic sensor 10 is specified using the same reference sign "13"; hence, a single probe card 9 includes a probe aggregation including a plurality of probes 13. For example, a single probe card 9 having a rectangular shape with a length of 10 cm for each side is equipped with twenty-five sets of probes 13 which can be concurrently brought into contact with twenty-five magnetic sensors 10 (i.e. 5×5 magnetic sensors arranged in a matrix form consisting of five rows of magnetic sensors and five columns of magnetic sensors) so as to concurrently inspect those magnetic sensors 10.

As shown in FIGS. 1 and 3, the probe 9 is fixed to the frame 2 such that the intermediate positions along four sides of a probe aggregation including a plurality of probes 13 (i.e. the intermediate position of five rows and the intermediate position of five columns) match the X-axis and the Y-axis of the magnetic field generating coils 3 to 8. In other words, the center position C (at which the axial directions of the magnetic field generating coils 3 to 8 are crossing each other) matches the center of a matrix consisting of three sets of probes 13 (i.e. the center of a matrix, i.e. third row, third column). Additionally, a plurality of magnetic field environment measuring sensors (MAG FLD) 14 to 17 and a plurality of temperature environment measuring sensors (TEMP) 18 to 21 are correspondingly paired and arranged in the peripheral portion of the probe card 9 externally of a probe aggregation including a plurality of probes 13.

The magnetic field environment measuring sensors 14 to 17 are each configured of three sensor chips, using magnetoresistive elements, with three-axial sensitivities in X-axis, Y-axis, and Z-axis directions; hence, they are each defined as a sensor with three-axial sensitivities in three axial directions perpendicular to each other at 90 degrees. The magnetic field environment measuring sensors 14 to 17 are sequentially electrified so as to measure a magnetic field in each axial direction.

The magnetic field environment measuring sensors 14 to 17 are disposed at intermediate positions on four sides of a square area, including a plurality of probes 13, in the peripheral portion of the probe card 9. That is, a pair of the magnetic field environment measuring sensors 14, 15 which are disposed at intermediate positions on the opposite sides is aligned in conformity with a pair of the magnetic field generating coils 3, 4 generating a magnetic field in the X-axis direction, whilst a pair of the magnetic field environment measuring sensors 16, 17 which are disposed at intermediate positions on the other opposite sides is aligned in conformity with a pair of the magnetic field generating coils 5, 6 generating a magnetic field in the Y-axis direction. As shown in FIGS. 3 and 4, a pair of the magnetic field environment measuring sensors 14, 15 is positioned oppositely in the X-axis direction, whilst a pair of the magnetic field environment measuring sensors 16, 17 is positioned oppositely in the Y-axis direction. The temperature environment measuring sensors 18 to 21 are positioned in proximity to the magnetic field environment measuring sensors 14 to 17.

The stage 12 is positioned under the probe card 9 having the probes 13, wherein the sensor aggregation 11 including a plurality of magnetic sensors 10 aligned on a wafer is mounted on the upper surface of the stage 12. The magnetic sensors 10 are produced on the surface of a wafer according to semiconductor processing and adhered together using dicing tapes, wherein the magnetic sensors 10 are divided into individual chips on dicing tapes and aligned in a matrix formed on dicing tapes, and wherein they are tightly held together by means of a carrier instrument (not shown) for each dicing tape. The sensor aggregation 11 including a plurality of magnetic sensors 10 tightly held together by means of a carrier instrument is mounted on the stage 12 and is fixed at the predetermined position by way of vacuum absorption. Additionally, the magnetic sensor inspection apparatus 1 is equipped with a transport part (not shown) which is able to move the stage 12 in the X-axis, Y-axis, and Z-axis directions.

As shown in FIG. 2, the magnetic field generating coils 3 to 8 are connected to a magnetic field controller (MAG FLD CONTROLLER) 25 equipped with a driver power source (not shown). The magnetic field controller 25 controls currents or voltages applied to magnetic field generating coils 3 to 8, thus controlling their magnetic fields. The probe card 9 is connected to a test controller 26 that sequentially electrifies the probes 13 according to the preprogrammed testing procedure so as to check the detection properties of the magnetic sensors 10 based on their output signals. The test controller 26 sends an instruction, regarding the magnitude and the directivity of a magnetic field, to the magnetic field controller 25. Based on the instruction of the test controller 26, the magnetic field controller 25 applies drive voltages to the magnetic field generating coils 3 to 8. Based on the measurement result of the magnetic field environment measuring sensors 14 to 17, the magnetic field controller 25 performs feedback control on drive voltages applied to the magnetic field generating coils 3 to 8. Based on the measurement result of the temperature environment measuring sensors 18 to 21 which are installed in the probe card 9 in proximity to the magnetic field environment measuring sensors 14 to 17, the magnetic field controller 25 corrects the measurement result of the magnetic field environment measuring sensors 14 to 17, which may fluctuate depending on the surrounding temperature, so as to control the magnetic intensity of the magnetic field generating coils 3 to 8 based on the corrected measurement result of the magnetic field environment measuring sensors 14 to 17.

The transport part of the stage 12 is connected to a stage controller 27 which controls the movement of the stage 12 in the X-axis, Y-axis, and Z-axis directions. As shown in FIG. 4, a heating medium circulation tube (HTG MED) 28 is embedded inside the stage 12. A temperature controller (TEMP CONTROLLER) 29 controls the temperature of a heating medium circulating through the heating medium circulation tube 28, thus heating the surface of the stage 12 at a desired temperature. In response to an instruction from the test controller 26, the temperature controller 29 controls the stage 12 at a desired temperature. The temperature controller 29 is subjected to feedback control based on either the detection result of a stage temperature sensor 30 embedded in the stage 12 or the detection results of the temperature environment measuring sensors 18 to 21 installed in the probe card 9.

In FIG. 1, a control box 31 encapsulates the magnetic field controller 25, the test controller 26, the stage controller 27, and the temperature controller 29 therein. Non-magnetic materials are selectively used for the constituent elements of the magnetic sensor inspection apparatus 1 so as not to influence the output signals of the magnetic sensors 10 undergoing a magnetic field. For example, the probes 13 are composed of phosphor bronze exhibiting spring property. The frame 2, the stage 12, and the carrier instrument are composed of titanium (Ti).

Next, a magnetic sensor inspection method for inspecting the magnetic properties of the magnetic sensors 10 with the magnetic sensor inspection apparatus 1 will be described.

A plurality of magnetic sensors 10 is formed on a wafer and already subjected to dicing on a dicing tape, which is tightly held by a carrier instrument. In this state, the magnetic sensors 10 are divided into individual pieces which are separated from each other and aligned in a matrix on a dicing tape, thus forming the sensor aggregation 11. In other words, the sensor aggregation 11 is a wafer-like array of magnetic sensors 10.

Figure 6:
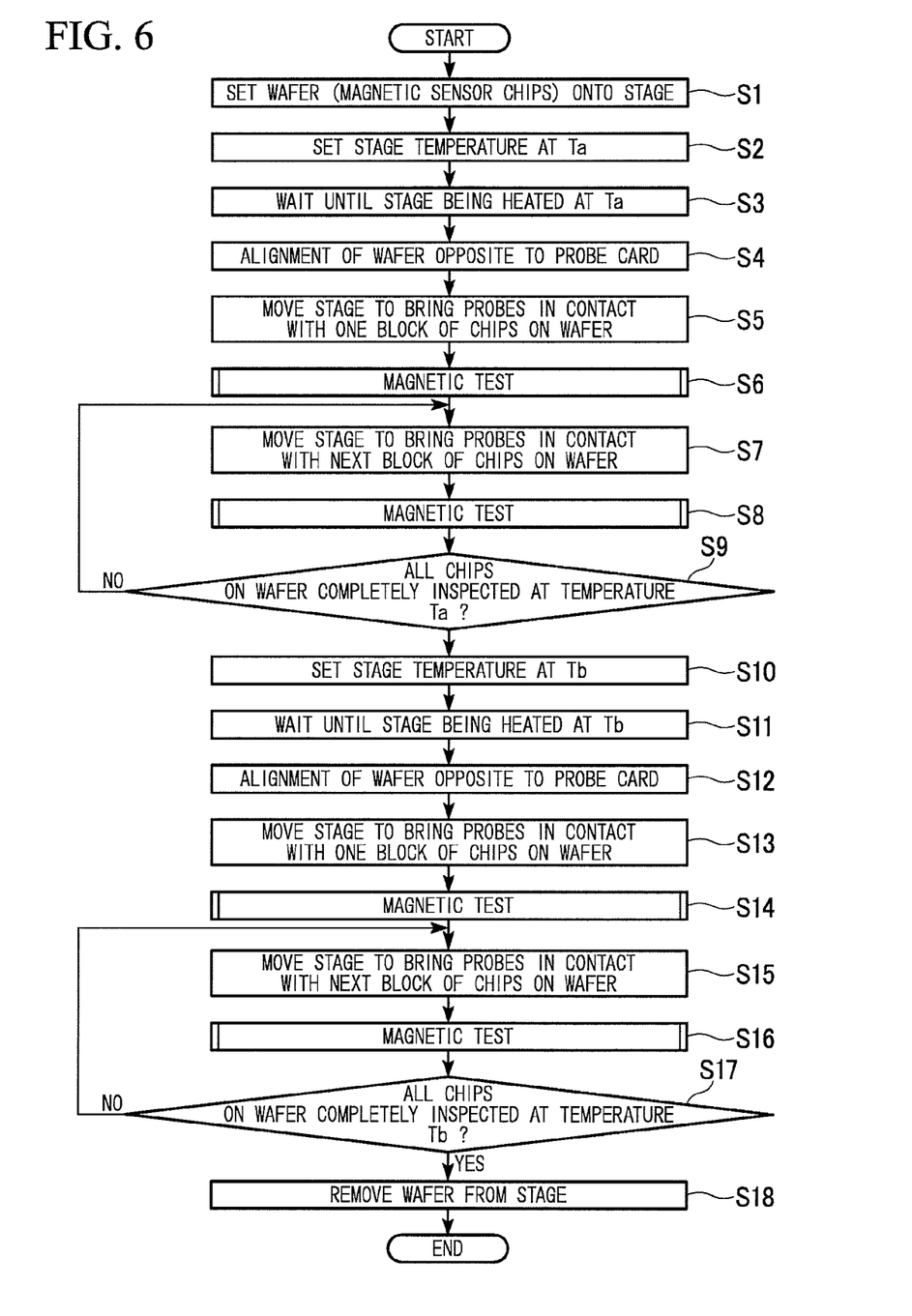
FIG. 6 is a flowchart of a magnetic sensor inspection method using the magnetic sensor inspection apparatus.

An inspection procedure for inspecting the magnetic property of each individual magnetic sensor 10 is carried out with respect to the sensor aggregation 11 (which is a wafer-like array of magnetic sensors 10) by way of the following steps (1) through (6), which will be described with reference to a flowchart of FIG. 6.

(1) The sensor aggregation 11 (which is a wafer-like array of magnetic sensors) is fixed onto the surface of the stage 12 by way of vacuum absorption (step S1). The temperature controller 29 controls a heating medium to circulate through the heating medium circulation tube 28 such that the surface temperature of the stage 12 is set to a predetermined temperature Ta (e.g. a high temperature) (steps S2, S3). The temperature controller 29 changes the temperature of a heating medium based on the temperature of the stage 12 which is detected with the stage temperature sensor 30, thus controlling the surface temperature of the stage 12 to match the predetermined temperature Ta.

(2) The transport part of the magnetic sensor inspection apparatus 1 moves the stage 12 so as to locate the probes 13 of the probe card 9 opposite to the magnetic sensors 10 concurrently subjected to inspection (step S4). Specifically, the probes 13 are positioned to oppositely face the twenty-five magnetic sensors 10 (i.e. the magnetic sensors 10 aligned in a matrix consisting of five rows and five columns). Subsequently, the transport part raises the stage 12 upwardly so that the probes 13 are brought into contact with the magnetic sensors 10 (step S5).

(3) Next, a magnetic test is conducted on the sensor aggregation 11 which is a wafer-like array of magnetic sensors 10 (step S6). Upon receiving an instruction from the test controller 26, the magnetic field controller 25 drives the magnetic field generating coils 3 to 8 so as to generate a desired magnetic field (i.e. a composite magnetic field in the X-axis, Y-axis, and Z-axis directions) inside the measurement area F (covering the specific magnetic sensors 10 in the sensor aggregation 11). At this time, the measurement result of the magnetic field environment measuring sensors 14 to 17 (which are disposed in the peripheral portion of the probe card 9 externally of the probes 13) are fed back to the magnetic field controller 25. The magnetic field controller 25 compares the measurement result of the magnetic field environment measuring sensors 14 to 17 to the preset values included in an instruction from the test controller 26, thus appropriately driving the magnetic field generating coils 3 to 8. Additionally, the temperature environment measuring sensors 18 to 21 (which are juxtaposed with the magnetic field environment measuring sensors 14 to 17 in the peripheral portion of the probe card 9) measure a temperature currently occurring in the probes 13 in contact with the magnetic sensors 10. Based on the measurement result of the temperature environment measuring sensors 18 to 21, the magnetic field controller 25 corrects sensitivity variation of the magnetic field environment measuring sensors 14 to 17 depending on the surrounding temperature, thus appropriately controlling drive voltages applied to the magnetic field generating coils 3 to 8 based on the corrected measurement result. That is, the magnetic sensor inspection apparatus 1 checks whether or not the magnetic intensity of a magnetic field currently applied to the measurement area F matches with a specified magnetic intensity before conducting a magnetic test. If the current magnetic intensity does not match with the specified magnetic intensity, the magnetic field controller 25 adjusts currents or voltages applied to the magnetic field generating coils 3 to 8, thus controlling their magnetic fields.

(4) Upon confirming the predetermined situation where a magnetic field having a specified magnetic intensity occurs in the measurement area F at the predetermined temperature Ta, the test controller 26 electrifies the probes 13 so as to conduct a magnetic test on each of the magnetic sensors 10 encompassed inside the measurement area F.

(5) Upon completing a magnetic test on one block of magnetic sensors 10 (i.e. twenty-five magnetic sensors 10 aligned in a matrix consisting of five rows and five columns), the transport part moves the stage 12 downwardly so as to release the contacts established between the probes 13 and the magnetic sensors 10.

(6) The transport part horizontally moves the stage 12 so as to locate the probes 13 oppositely to the next block of magnetic sensors 10 (step S7). Then, the foregoing operations (2) to (5) are repeatedly performed (step S8). By repeating a series of operations (2) to (5), the magnetic sensor inspection apparatus 1 repeatedly performs a magnetic test at the predetermined temperature Ta while moving the probes 13 to concurrently come in contact with the magnetic sensors 10 of each block, thus completing magnetic testing on a wafer-like array of magnetic sensors 10 (steps S7 to S9).

After completing magnetic testing on a wafer-like array of magnetic sensors 10 at the predetermined temperature Ta, the temperature controller 29 changes the temperature of the stage 12 with another temperature Tb (e.g. a low temperature) (step S10). Then, the magnetic sensor repeats a series of operations (2) to (6) so as to conduct magnetic testing on a wafer-like array of magnetic sensors 10 at the temperature Tb (steps S11 to S17 corresponding to steps S3 to S9). After completing magnetic testing at the temperature Tb, the magnetic sensor inspection apparatus 1 exits the flowchart of FIG. 6, wherein the tested wafer (including the magnetic sensors 10) is removed from the stage 12 (step S18).

The magnetic sensor inspection method is not necessarily limited in terms of the feedback control of a magnetic field described in the operation (3). However, it is possible to achieve the feedback control of a magnetic field as follows.

A magnetic field exerted on the measurement area F is a composite magnetic field appropriately combining magnetic fields generated with the magnetic field generating coils 3 to 8 in the X-axis, Y-axis, and Z-axis directions. The magnetic field environment measuring sensors 14 to 17, each of which is able to measure a magnetic field in three axial directions, measure the composite magnetic field combining magnetic fields in axial directions. Among the four magnetic field environment measuring sensors 14 to 17 installed in the probe card 9, the two magnetic field environment measuring sensors 14, 15 aligned in the X-axis direction, produce X-axis measurement results, which are averaged to determine magnetic field intensity in the X-axis direction. Additionally, the two magnetic field environment measuring sensors 16, 17 aligned in the Y-axis direction, produce Y-axis measurement results, which are averaged to determine magnetic field intensity in the Y-axis direction. Moreover, it is possible to determine magnetic field intensity in the Z-axis direction by averaging the measurement results of the four magnetic field environment measuring sensors 14 to 17. The reason why the probe card 9 does not install magnetic field environment measuring sensors aligned in the Z-axis direction is (a) physical constraint and (b) difficulty of determining magnetic field intensity in the Z-axis direction which may be significantly varied in the plane of the stage 12 and among a plurality of chips subjected to measurement. The reason (a) is a prominent factor in which it is difficult to additionally arrange magnetic field environment measuring sensors in a small space between the probe card 9 and the stage 12 which sandwich a wafer subjected to magnetic testing. Considering this factor, however, the four magnetic field environment measuring sensors 14 to 17, each configured of a three-axis sensor, are aligned on the probe card 9 in four directions. This makes it possible to virtually measure the Z-axis magnetic field intensity by averaging the measurement results of the four magnetic field environment measuring sensors 13 to 17. The magnetic field controller 25 compares the measured magnetic field intensities of two or three axial directions with the desired values included in an instruction from the test controller 26 so as to determine variants, based on which the magnetic field controller 25 controls the magnetic field generating coils 3 to 8 so as to correct their magnetic fields.

The feedback control is performed every time the transport part of the magnetic sensor inspection apparatus 1 moves the stage 12 so as to bring the probes 13 in contact with the next block of magnetic sensors 10.

It is presumed that a magnetic field may not greatly fluctuate due to the movement of the stage 12 because the constituent elements of the magnetic sensor inspection apparatus 1 are formed using non-magnetic materials. Due to the arrangement of a power source driving motors which may be separated from the measurement area F, however, it is necessary to perform feedback control in response to a magnetic field measured every time the stage 12 is moved from one place to another. At this time, it is necessary to correct the measurement result of the magnetic field environment measuring sensors 14 to 17 based on the measurement result of the temperature environment measuring sensors 18 to 21, thus controlling drive signals supplied to the magnetic field generating coils 3 to 8 based on the corrected measurement result regarding a magnetic field.

It is possible to confirm the temperature of the stage 12 with either the stage temperature sensor 30 (embedded in the stage 12) of the temperature environment measuring sensors 18 to 21 installed in the probe card 9, wherein the temperature controller 29 controls a heating medium to circulate through the heating temperature circulation tube 28 in response to an instruction from the test controller 26. Herein, a temperature adjuster for adjusting the temperature of the stage 12 is formed using a combination of the heating medium circulation tube 28 and the stage temperature sensor 30 or a combination of the temperature environment measuring sensors 18 to 21 and the temperature controller 29.

As described above, the magnetic sensor inspection apparatus 1 is designed to inspect a wafer-like array of magnetic sensors 10 instead of individual pieces of magnetic sensors 10, wherein it is possible to concurrently inspect a plurality of magnetic sensors 10 in a magnetic field concurrently exerted on these magnetic sensors 10. This improves a handling scheme of magnetic sensors, thus improving productivity in manufacturing magnetic sensors precluding defective ones.

During the inspection procedure, the magnetic field environment measuring sensors 14 to 17 (installed in the probe card 9) measure a magnetic field exerted on the measurement area F so as to feed it back to the magnetic field controller 25. This helps accurately generate a desired magnetic field in the measurement area F, thus improving inspection accuracy. During the inspection procedure, the measurement result of the magnetic field environment measuring sensors 14 to 17 which may fluctuate depending on the surrounding temperature is corrected (or adjusted) based on the measurement result of the temperature environment measuring sensors 18 to 21. This makes it possible to accurately control a magnetic field based on the corrected measurement result (regarding a magnetic field); hence, it is possible to conduct magnetic testing with high accuracy.

As described heretofore, the present invention is not necessarily limited to the present embodiment, which can be further modified within the scope of the invention as defined in the appended claims.

For example, the present embodiment arranges the four magnetic field environment measuring sensors 14 to 17 surrounding the measurement area F; but this is not a restriction. It is possible to arrange a single magnetic field environment measuring sensor, two or more magnetic field environment measuring sensors. The present embodiment employs three-axis sensors, but it is possible to employ combinations of two-axis sensors and one-axis sensors. FIG. 5 shows the probes 13 which perpendicularly project from the probe 9, but it is possible to incline the probes 13 which thus project with slanted angles from the probe 9. The present embodiment is designed to concurrently inspect a plurality of magnetic sensors 10 adhered to a dicing tape, but it is possible to inspect a wafer which is not subjected to dicing so that the magnetic sensors 10 are not adhered to a dicing tape.

What is claimed is:

1. A magnetic sensor inspection apparatus comprising:
   a stage for mounting a wafer-like array of magnetic sensors thereon, which is movable in a horizontal direction and a vertical direction;
   a probe card which is positioned opposite to the stage and which is equipped with a plurality of probes that are brought into contact with the plurality of magnetic sensors encompassed in a measurement area;
   a plurality of magnetic field generating coils which are positioned to surround the probe card and the stage so as to generate a magnetic field toward the plurality of magnetic sensors mounted on the stage;
   a plurality of magnetic field environment measuring sensors which are disposed in a peripheral portion of the probe card surrounding the plurality of probes; and
   a magnetic field controller for controlling magnetic fields generated by the magnetic field generating coils based on the measurement result of the plurality of magnetic field environment measuring sensors.

2. The magnetic sensor inspection apparatus according to claim 1, further comprising a plurality of temperature environment measuring sensors which are positioned in proximity to the plurality of magnetic field environment measuring sensors in the peripheral portion of the probe card, wherein the magnetic field controller corrects the measurement result of the plurality of magnetic field environment measuring sensors based on the measurement result of the plurality of temperature environment measuring sensors, thus controlling magnetic fields generated by the magnetic field generating coils based on the corrected measurement result regarding the magnetic field applied to the plurality of magnetic sensors mounted on the stage.

3. The magnetic sensor inspection apparatus according to claim 2, further comprising a temperature adjuster for adjusting a temperature of the stage.

4. The magnetic sensor inspection apparatus according to claim 3, wherein the temperature adjuster includes a temperature controller, a heating medium circulation tube embedded inside the stage, a stage temperature sensor embedded inside the stage and disposed beneath the wafer including the plurality of magnetic sensors, as well as the plurality of temperature environment measuring sensors, and wherein the temperature controller controls a heating medium circulating through the heating medium circulation tube based on a stage temperature detected by the stage temperature sensor as well as the measurement result of the plurality of temperature environment measuring sensors.

5. A magnetic sensor inspection method comprising:
   preparing a magnetic sensor inspection apparatus including a stage, a probe card having a plurality of probes, a plurality of magnetic field generating coils surrounding the stage and the probe card, and a plurality of magnetic field environment measuring sensors disposed in a peripheral portion of the probe card surrounding the plurality of probes;
   mounting a wafer-like array of magnetic sensors on the stage;
   moving the stage in a horizontal direction and/or a vertical direction so as to bring the plurality of probes in contact with the plurality of magnetic sensors on the stage;
   driving the plurality of magnetic field generating coils so as to generate a magnetic field toward the plurality of magnetic sensors on the stage;
   adjusting magnetic fields generated by the magnetic field generating coils by way of feedback control based on the measurement result of the plurality of magnetic field environment measuring sensors; and
   concurrently inspecting the plurality of magnetic sensors with the probe card.

6. The magnetic sensor inspection method according to claim 5 further comprising:
   correcting the measurement result of the plurality of magnetic field environment measuring sensors based on the measurement result of a plurality of temperature environment measuring sensors, which are positioned in proximity to the plurality of magnetic field environment measuring sensors in the peripheral portion of the probe card; and
   controlling magnetic fields generated by the magnetic field generating coils based on the corrected measurement result regarding the magnetic field applied to the plurality of magnetic sensors mounted on the stage.

7. The magnetic sensor inspection method according to claim 5 further comprising:
   measuring a stage temperature of the stage; and
   controlling a heating medium circulating through a heating medium circulation tube embedded inside the stage, thus adjusting the stage temperature at a desired temperature.

* * * * *